United States Patent
Bojarczuk, Jr. et al.

(10) Patent No.: US 6,861,728 B2
(45) Date of Patent: Mar. 1, 2005

(54) DIELECTRIC STACK WITHOUT INTERFACIAL LAYER

(75) Inventors: Nestor A. Bojarczuk, Jr., Poughkeepsie, NY (US); Eduard A. Cartier, New York, NY (US); Matthew W. Copel, Yorktown Heights, NY (US); Supratik Guha, Chappaqua, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/326,635

(22) Filed: Dec. 20, 2002

(65) Prior Publication Data

US 2003/0104666 A1 Jun. 5, 2003

Related U.S. Application Data

(62) Division of application No. 09/777,094, filed on Feb. 5, 2001, now Pat. No. 6,528,374.

(51) Int. Cl.$^7$ .............................................. H01L 29/00
(52) U.S. Cl. ........................ 257/532; 257/528; 257/295
(58) Field of Search ................................ 257/201, 496, 257/295, 52, 347, 528, 532, 200

(56) References Cited

U.S. PATENT DOCUMENTS 6,307,225 B1 * 10/2001 Kijima et al. ............... 257/295

6,521,911 B2 * 2/2003 Parsons et al. ............... 257/52
2002/0187644 A1 * 12/2002 Baum et al. ................ 438/700

OTHER PUBLICATIONS

Parsons et al. "Ytterium Silicate formation on silicon: Effect of preoxidation and nitridation on interface reaction kinetics" Oct. 2000, Applied Physics Letters vol. 77 no 15 p 2385–7.*

* cited by examiner

*Primary Examiner*—Brad Smith
(74) *Attorney, Agent, or Firm*—Robert M. Trepp; F. Chau & Associates, LLC

(57) ABSTRACT

A method of forming a dielectric stack device having a plurality of layers comprises the steps of providing a silicon substrate, forming a metal-oxide layer on a silicon oxide layer which is formed on the silicon substrate, and performing an annealing with respect to the metal-oxide layer and the silicon oxide layer until a silicate layer is formed to replace the metal-oxide layer and the silicon oxide layer is removed, wherein the annealing is performed at a temperature between about 800° C. and about 1000° C. for a time period between about 1 second and about 10 minutes. After forming the silicon oxide layer on the silicon substrate, the metal-oxide layer may be deposited on the silicon oxide layer. Alternatively, the metal-oxide layer may be deposited on the silicon substrate, and the silicon oxide layer grows between the metal-oxide layer and the silicon substrate. The metal-based oxide is preferably an Yttrium-based oxide.

8 Claims, 6 Drawing Sheets

DIELECTRIC STACK WITHOUT INTERFACIAL LAYER

CROSS-REFERENCE TO RELATED APPLICATION

This application is a divisional of U.S. Ser. No.: 09/777,094, entitled "METHOD FOR FORMING DIELECTRIC STACK WITHOUT INTERFACIAL LAYER," filed on Feb. 5, 2001, now U.S. Pat. No. : 6,528,374, the disclosure of which in its entirety is incorporated by reference herein.

BACKGROUND OF THE INVENTION

1. Field of the Invention

The present invention relates to fabrication of semiconductor devices, and more particularly, to a method of forming a silicate based dielectric on a silicon substrate and a semiconductor device formed thereby.

2. Description of the Related Art

In semiconductor devices such as complementary metal oxide semiconductor (CMOS) devices, a silicon dioxide ($SiO_2$) based gate dielectric is formed on a silicon substrate. With increased miniaturization of transistors in CMOS devices, there has been an impetus to replace $SiO_2$ as the gate dielectric with alternative material that has a higher dielectric constant. This is because the feasibility of CMOS scaling is increasingly dependent on the gate dielectric.

To increase the integration density of semiconductor devices, the thickness of $SiO_2$ layers has been reduced. However, the reduction of the thickness of $SiO_2$ layers causes a problem of diminishing reliability of the $SiO_2$ layers as gate dielectrics. Evidence of diminished reliability for $SiO_2$ layers thinner than 25 Å has been reported, and more recently revised to 16 Å. More recent assessments indicate diminished reliability for thickness below 16 Å.

Further reduction of the thickness of $SiO_2$ layers would eventually require replacement of the $SiO_2$ layers with some alternative material with a higher dielectric constant. An approach pursued by numerous groups is to create a dielectric stack, with an interfacial layer of $SiO_2$ and an overlayer of a high permittivity dielectric, such as a metal oxide or silicate. Although the interface between silicon substrate and $SiO_2$ layer is known to have good stability, this approach still has such drawbacks as the $SiO_2$ layer limits the capacitance of the stack and fabrication of the stack on an atomic length scale.

Thus, alternative dielectrics are highly desirable if they can provide an equivalent capacitance with a reduced leakage current, taking account of numerous other considerations such as compatibility with silicon, thermal robustness, and ease of integration and deposition. A practical limit on the capacitance of a metal-oxide or a silicate on silicon structure is posed by the occurrence of an interfacial layer of $SiO_2$. The interfacial layer may arise from substrate oxidation during dielectric growth, or it may be caused by post-growth oxidation, or it could even be a remnant from a preexisting $SiO_2$ layer.

Fabrication of a semiconductor stack formed of metal-oxide and silicon layers adjacent to each other is severely hampered by the unfortunate fact that most metal-oxides are highly permeable to oxygen. If deposition of a metal-oxide layer is performed at elevated temperatures and in an oxygen rich ambient, excess oxygen can diffuse through the metal-oxide dielectric layer and react with the silicon substrate. For example, when a compound such as zirconium (Zr) oxide or hafnium (Hf) oxide is deposited on hydrofluoric (HF) etched silicon surfaces, there is generally formed an interfacial $SiO_2$ layer having the thickness of 5–15 Å. Metals such as lanthanum (La) and yttrium (Y), which easily form silicates, develop both an interfacial $SiO_2$ layer and a significant level of Si (e.g., 10–15 at %), which may further reduce the capacitance of the stack. Further, once the metal-oxide layer is deposited, post-growth oxidation may be needed to reduce the leakage current, which will also reduce the capacitance of the stack.

It is well known that when $SiO_2$ is heated in the ultrahigh vacuum (UHV), it is converted into SiO which is volatile. Thus, $SiO_2$ formed on a substrate can be removed from the substrate by thermal treatments in the UHV circumstances. Furthermore, the reaction is known to be inhomogeneous, starting with pinholes that gradually merge. The reaction takes place at temperatures ranging from 800° C. to 1050° C., depending on the thickness of the $SiO_2$ layer.

However, although most metal-oxides are highly permeable to oxygen, the removal of the $SiO_2$ layer formed on the Si substrate during a metal-oxide deposition has not been successful. For example, investigation of a film formed of layers of "$ZrO_2/SiO_2/Si(001)$" shows that at temperatures between 900° C. and 1000° C., the film is converted into islands of Zr silicide. Another investigation of a film where $Al_2O_3$ layer is deposited on a Si substrate shows a different pathway to dissociation, that is, volatilization of the metal and conversion of the surface to atomically clean, albeit rough, Si(100). In other investigations as well as the above examples, it is shown that oxygen loss is accompanied by the catastrophic destruction of the dielectric.

In addition to the above-mentioned approaches to solve the $SiO_2$ layer problem, there has been provided a method of minimizing Si-intermixing between a metal oxide layer and a Si substrate. This method is described in "Yttrium Silicate Formation on Silicon: Effect of Silicon Pre-oxidation and Nitridation on Interface Reaction Kinetics", by Chambers et al., October 2000, Applied Physics Letters, Vol. 77, No. 15, pp. 2385–2387. Chambers et al. describe a method for minimizing Si-intermixing by introducing barrier layers of nitrided silicon interfacial layer between a metal-oxide layer and a Si substrate. However, Chambers et al. have not provided any information regarding the removal of $SiO_2$ formed by depositing the metal-oxide on the Si substrate.

Therefore, a need exists for a method of forming a dielectric stack having a dielectric layer which replaces a conventional $SiO_2$-based dielectric layer. Further, it will be advantageous to provide a method of forming a dielectric stack which has characteristics of increased capacitance and reduced leakage current.

OBJECTS AND SUMMARY OF THE INVENTION

It is an object of the present invention to provide a method of forming a dielectric stack having substantially no interfacial layer between a silicon substrate and a dielectric layer.

It is another object of the present invention to provide a method of forming a dielectric stack having a thin silicate layer as a dielectric layer formed directly on a silicon substrate.

It is further object of the present invention to provide a method of forming a dielectric stack having increased capacitance and reduced leakage current.

It is still another object of the present invention to provide a method of forming a dielectric stack having a silicate layer and a silicon substrate without performing an HF etching of the silicon substrate.

To achieve the above and other objects, the present invention provides a method of forming a dielectric stack device having a plurality of layers, comprising the steps of providing a silicon substrate; forming a metal-oxide layer on a silicon oxide layer which is formed on the silicon substrate; and performing an annealing with respect to the metal-oxide layer and the silicon oxide layer until a silicate layer is formed to replace the metal-oxide layer and the silicon oxide layer is removed, wherein the annealing is performed at temperatures between about 800° C. and about 1000° C. for a time period between about 1 second and about 10 minutes.

The formation of the metal-oxide layer may include forming the silicon oxide layer on the silicon substrate, and depositing the metal-oxide layer on the silicon oxide layer. Alternatively, the formation of the metal-oxide layer may include depositing the metal-oxide layer on the silicon substrate, wherein the silicon oxide layer grows between the metal-oxide layer and the silicon substrate. The silicon oxide layer may be a silicon dioxide layer or a silicon oxynitride layer. The metal-oxide layer preferably comprises Yttrium. The annealing is performed at temperatures which are directly related to thickness of the metal-oxide layer and/or the silicon oxide layer. For example, in case that the metal-oxide or silicon oxide layer is thicker, the temperatures for the annealing need to be higher.

The present invention also provides a dielectric stack device comprising a silicon substrate, and a silicate layer in direct contact with the silicon substrate, wherein substantially no silicon dioxide layer exists between the silicon substrate and the silicate layer. The silicate layer preferably contains Yttrium and is substantially free of pinholes.

These and other objects, features and advantages of the present invention will become apparent from the following detailed description of the preferred embodiments thereof, which is to be read in conjunction with the accompanying drawings, wherein like elements are designated by identical reference numbers throughout the several views.

BRIEF DESCRIPTION OF THE DRAWINGS

This disclosure will present in detail the following description of preferred embodiment with reference to the following figures wherein.

DESCRIPTION OF PREFERRED EMBODIMENTS

Detailed illustrative embodiments of the present invention are disclosed herein. However, specific structural and functional details disclosed herein are merely representative for purposes of describing preferred embodiments of the present invention.

The present invention provides a method for forming a dielectric stack having substantially no interfacial silicon dioxide ($SiO_2$) layer between a dielectric and a silicon substrate of the stack. The method of the present invention basically includes the processes of deposition of a metal-oxide on a silicon substrate and thermal processing of a metal-oxide based dielectric and a silicate based dielectric. The thermal processing has the effect of substantially removing an interfacial $SiO_2$ layer formed between the dielectric and the silicon substrate.

Although, as mentioned above, the oxygen loss in most metal-oxides results in the destruction of the dielectric, the oxygen loss for certain metal-oxides and temperatures can be beneficial to formation of a desirable dielectric. In other words, for certain metal-oxides and temperatures, the oxygen loss makes it possible to remove an interfacial $SiO_2$ layer underneath the metal-oxide without damaging the metal-oxide. As a result, there is an increase in the capacitance of the dielectric stack, for example, the capacitance between a gate and a channel of a field effect transistor formed of the dielectric stack.

Figure 1:
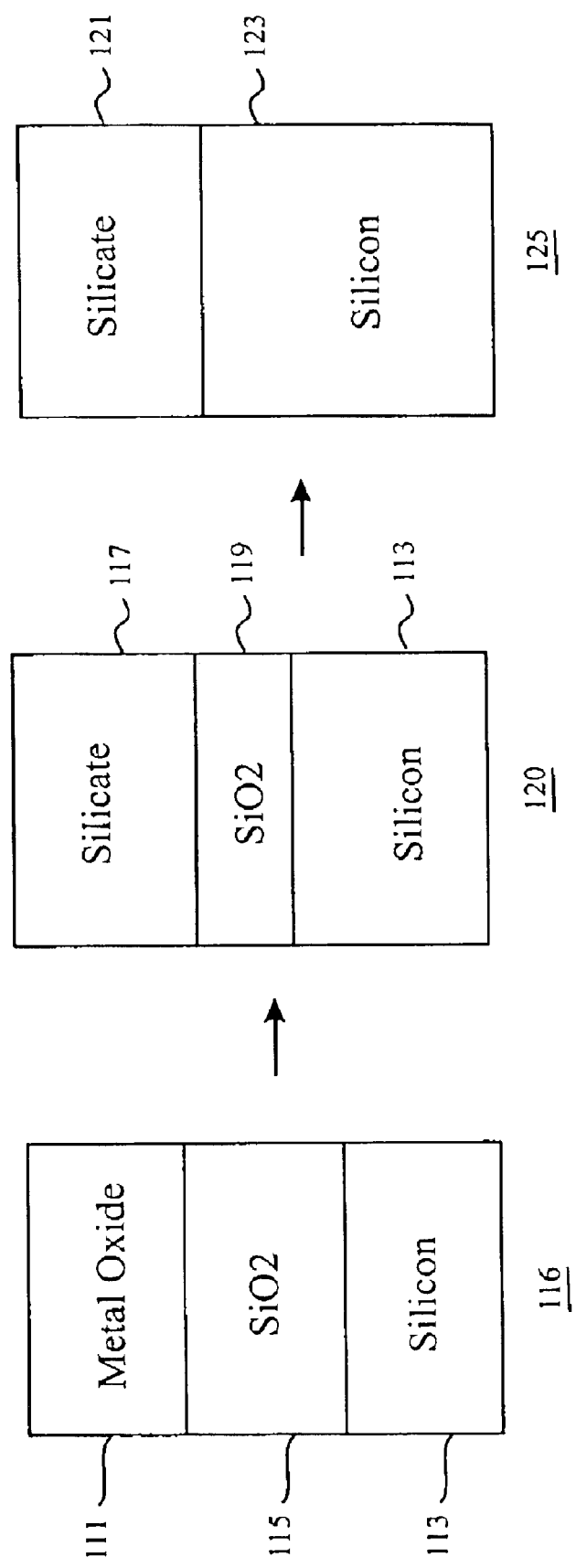
FIG. 1 is simplified sectional views of a dielectric stack for explaining a method of forming a dielectric stack according to the present invention.

Referring to FIG. 1, there is provided simplified sectional views of a dielectric stack for explaining a method of forming a dielectric stack according to the present invention. The method in FIG. 1 includes the processes of depositing a metal-oxide layer 111 on a silicon substrate 113, where a interfacial $SiO_2$ layer 115 is formed there between, and performing an annealing process with respect to the sample 116 (i.e., the stack of the metal-oxide layer 111, silicon substrate 113, and interfacial $SiO_2$ layer). As the annealing process proceeds, the metal-oxide layer 111 and the silicon dioxide layer 115 are converted into a silicate layer 117 and a silicon dioxide layer 119. When the annealing process is continuously performed with respect to the sample 120 (i.e., the stack of the silicate layer 117, interfacial $SiO_2$ layer 119, and the silicon substrate 113) at certain temperatures for a certain time period, the interfacial $SiO_2$ layer 119 is removed so as to produce a dielectric stack having a silicate dielectric 121 formed directly on a silicon substrate 123. A detailed description of the processes will be provided with reference to the pertinent drawings.

The present invention employs a rare earth element, preferably yttrium (Y), for the metal-oxide 111. The metal-oxide layer 111, preferably, a film formed of "$Y_2O_3$", is deposited on the silicon substrate 113 by evaporation of Y in an oxygen flux. During the deposition, the sample 116 is preferably held at about 600° C.

The metal-oxide layer 111 is grown on the silicon substrate 113. In particular, an Y-based oxide thin film dielectric is grown on the Si substrate by ultrahigh vacuum (UHV) atomic beam deposition. The Y-oxide dielectric may be grown in a modified molecular beam epitaxy chamber equipped with a radio frequency discharge source used to excite $O_2$ molecules flowing through it to produce a beam of atomic oxygen directed at the sample surface. The metal-oxygen layer 111 can also be formed by chemical vapor deposition, atomic layer chemical vapor deposition, plasma enhanced chemical vapor deposition, physical vapor deposition in an oxidizing ambient, or physical vapor deposition from a metal oxide target.

The Si substrate 113 may be previously dipped in the HF solution to produce a hydrogen terminated hydrophobic surface, followed by loading and outgassing at about 200° C. in the vacuum chamber. The growth of the Y-based oxide is carried out by exposing the substrate surface to both the metal (Y) and oxygen (O) beams at substrate temperatures varying from about 350° C. to about 750° C. A flux of the metal (Y) arriving at the surface of the Si substrate is oxidized due to the presence of a larger oxygen flux, resulting in the growth of a metal oxide layer. The growth rate is at about 0.4 nm/min. Yttrium, which posses a low vapor pressure, can be evaporated using a high temperature effusion cell operating at about 1300–1500° C. and evaporated from a Ta crucible.

Upon having grown, the sample is removed from the growth system and analyzed in a micro-structural analysis carried out by cross-sectional transmission electron microscopy (TEM) and medium energy ion scattering (MEIS). Samples for electrical measurements are made, for example, by thermally evaporating Al dots on the dielectric layer to form "Si/dielectric/Al" capacitors. Annealing prior to the electrical testing may be carried out either in air or in forming gas at temperatures between about 350–550° C.

Figure 2:
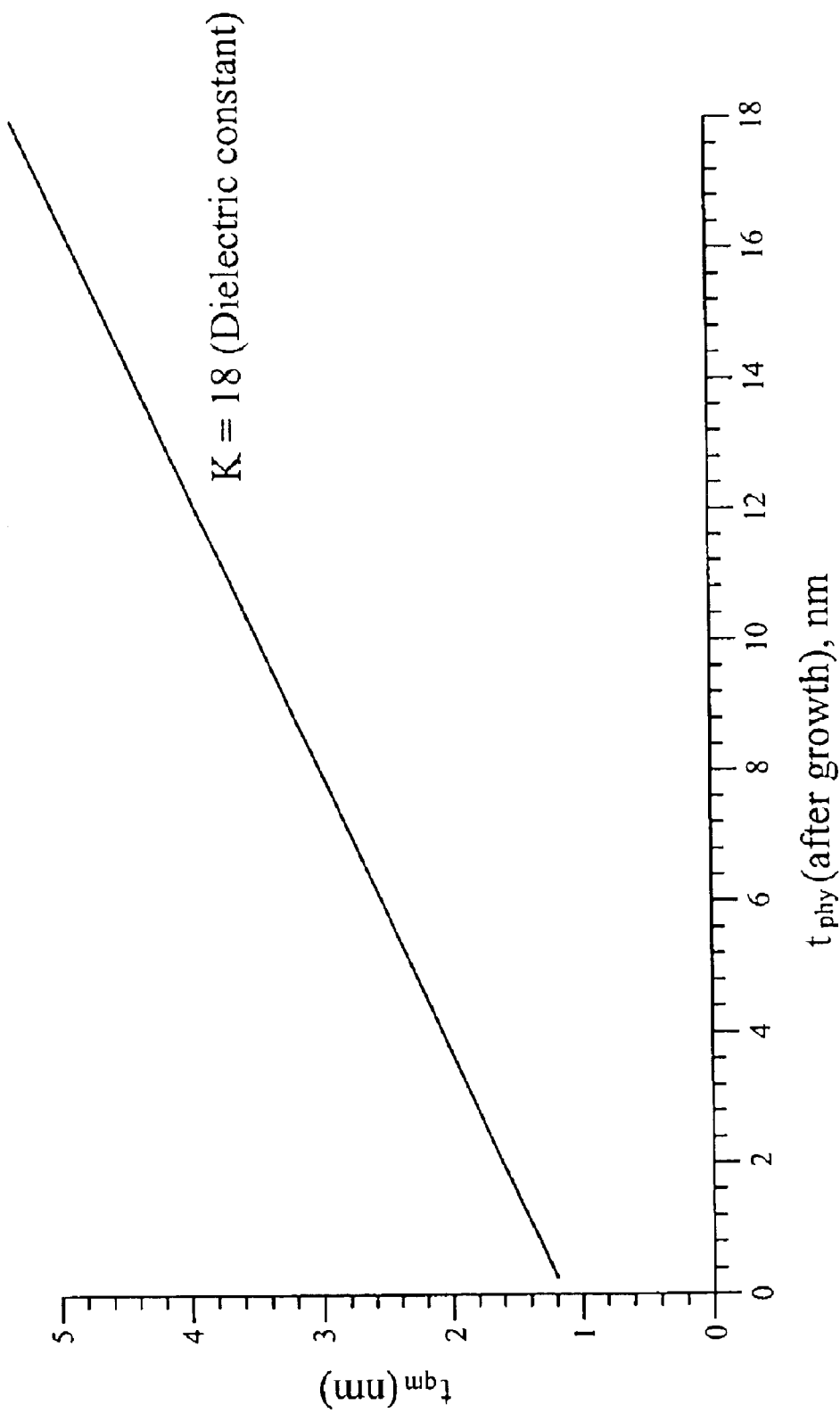
FIG. 2 is a graph for explaining the thickness of layers in the dielectric stack according to the present invention.

FIG. 2 shows electrical thickness ($t_{qm}$) of the Y-based oxide film measured from the accumulation capacitance plotted against physical thickness ($t_{phy}$) of the film measured by ellipsometry. The slope in FIG. 3 indicates the dielectric constant (K) which is estimated to be approximately "18" for the Y-based oxide film. The extrapolated intercept on the ordinate at "$t_{phy}=0$" indicates the presence of an interfacial layer with an equivalent electrical thickness of about 1.3 nm for the Y-based oxide film.

The growth of the Y-based oxide film results from the exposure of the film to the ambient. In other words, the Y-based oxide film with thickness of about 4–5 nm acts as a poor diffusion barrier to moisture or oxygen, resulting in the growth of the interfacial $SiO_2$ layer.

It should be noted that the metal-based oxide (e.g., Y-based oxide) can also be deposited on a silicon oxide layer which is previously formed on the Si substrate. In this case, the silicon oxide layer is preferably either an $SiO_2$ layer or a silicon oxynitride layer.

Upon forming the metal-oxide layer 111 and the interfacial $SiO_2$ layer 115 on the silicon substrate 113, the sample 116 undergoes the annealing process in UHV and is preferably examined by MEIS during the annealing. The sample 116 at the beginning of the annealing is a stack formed of "metal-oxide/$SiO_2$/Si-substrate" in which the metal-oxide layer has the composition of "Y(0.24)Si(0.10)O(0.64)" and the thickness of about 26 Å and the interfacial $SiO_2$ layer has the thickness of about 15 Å. The annealing is performed at temperatures between about 800° C. and about 1000° C. and for a time period between about 1 second and about 10 minutes. Preferably, the annealing is performed in an ambient substantially free from oxygen.

By performing the annealing with respect to the sample 116 at certain temperatures for a certain time period, preferably, at about 900° C. and for about 60 seconds, the metal oxide layer 111 and the interfacial $SiO_2$ layer 115 are converted into the silicate layer 117 and the $SiO_2$ layer 119. For convenience of the explanation, this process of converting the sample 116 into the sample 120 can be called a first annealing process.

As a result of the first annealing, the metal-oxide layer 111 is converted into the silicate layer 117, for example, the Y-based oxide layer is converted into Y-silicate ($Y_2Si_2O_7$) layer, in which the thickness of the dielectric layer is changed from about 26 Å (the Y-based oxide layer) to about 32 Å (the Y-silicate layer). The thickness of the interfacial $SiO_2$ layer is also changed from about 15 Å (the layer 115) to about 6 Å (the layer 119). Thus, the sample 120 is formed of the Si substrate 113, the Y-silicate layer 117, and the interfacial $SiO_2$ layer 119 formed between the layers 113 and 117.

During the first annealing, $SiO_2$ in the interfacial layer 115 is intermixed with the Y-based oxide in the layer 111. As a result, the silicate layer 117 is formed to have the most Si rich silicate phase.

Upon forming the sample 120, the annealing process is continued with respect to the sample 120. During or upon the annealing process, the interfacial $SiO_2$ layer 119 is removed (or desorbed) so that the sample 120 is converted into a stack 125 of the Si substrate 123 and the silicate layer 121 which directly formed on the substrate 123. Thus, the dielectric stack 125 has substantially no $SiO_2$ between the dielectric layer 121 and the Si substrate 123. For convenience of the explanation, this process of converting the sample 120 into the dielectric stack 125 can be called a second annealing process. Preferably, the second annealing is performed at temperatures about 950° C. and for a time period about 30 seconds in the ambient substantially free from oxygen.

During the second annealing process, the $SiO_2$ in the interfacial layer 119 is desorbed from the sample 120, possibly, in the form of "SiO", which is volatile at the temperatures for the annealing. Alternatively, it is also possible that the $SiO_2$ in the interfacial layer 119 is reduced to its elemental constituents, i.e., oxygen and silicon. As a result, the oxygen is desorbed and the silicon is returned to the silicon substrate.

It should be noted that during the second annealing, the $SiO_2$ in the interfacial layer 119 is not intermixed with the silicate in the dielectric layer 117 because the silicate layer 117 is already saturated with silicon. It should also be noted that the silicate layer formed through the annealing process has substantially no pinholes. In conventional dielectric stack devices, pinholes are formed in a dielectric layer due to an annealing process performed at higher temperatures for a longer time period. In contrast, the annealing process in the present invention is performed at reduced temperatures (e.g., 850–1000° C.) for a shortened time period (e.g., 1 sec to 10 min), so that substantially no pinhole is formed in the silicate layer.

Accordingly, the dielectric stack of the present invention has the silicate layer 121 saturated with silicon formed on the silicon substrate 123, with substantially no interfacial layer between the silicate layer 121 and the silicon substrate 123. For example, while the thickness of the silicate layer 121 may be in the range between about 1 Å and about 50 Å, an interfacial layer, if any, has a thickness less than about 3 Å.

To form the silicate layer 121, the annealing processes of the present invention can be applied to either the deposition of Y, the Y-based oxide layer, or a Y-based hydroxide layer. It should be noted that the present invention is not limited to Y-based oxide for the formation of the metal-oxide layer 111, but includes an alloy containing Y mixed with another metal, such as Al, Zr, Hf, La, Sc, La, Gd, Mg, Ti, or Ce. In this case, the first and second annealing processes are also performed at the temperatures between about 800° C. and about 1000° C., preferably at about 950° C., and for a time period between about 1 second and about 10 minutes, preferably 30 seconds.

The dielectric stack of the present invention may have a silicon-on-insulator substrate on which the metal-oxide is deposited to form the silicate layer. The dielectric stack of the present invention may also have either a polysilicon layer or a conductive metal contact layer. The polysilicon layer may be doped to achieve high conductivity. The conductive metal layer may be composed of Ni, Co, TiN, Al, W, Pt, Ru, Ru oxide, or a compound containing those materials. The conductive metal layer may be formed on the silicate layer of the dielectric stack. Adjacent contact regions can be formed in the dielectric stack to form field effect transistors.

An additional insulating layer may be placed superjacent the dielectric stack. The insulating layer may be silicon oxide, silicon nitride, or an oxide or silicate of Al, Zr, Hf, La, Sc, Y, Gd, Mg, Ti oxides, or a mixture thereof.

The process of forming the dielectric stack of the present invention may further include an oxidation process to improve the electrical resistance. The oxidation process is preferably performed upon completing the annealing process of the present invention. In the oxidation process, the silicate layer of the dielectric stack is oxidized.

The process may also include a forming gas annealing process at temperatures between about 300° C. and about 650° C. for a time period between about 10 minutes and about 12 hours, preferably, at temperature about 600° C. for about 30–60 minutes. The forming gas annealing process is preferably performed upon completing the annealing of the present invention.

The process may also include a post-metallization annealing process at temperatures between about 200° C. and about 400° C. for a time period between about 10 minutes and about 12 hours, preferably, at temperature about 300° C. for about 30 minutes. The post-metallization annealing process may be formed upon completing the annealing of the present invention and the metallization of the conductive metal layer on an insulating layer.

In application of the dielectric stack of the present invention, the silicate layer may be used as a gate dielectric insulation layer in a field effect transistor (FET), ferroelectric memory element, dynamic random access memory node, or capacitive device.

In general, dielectrics may have significant quantities of charge either internally or at the interface of a dielectric and a silicon substrate. This is harmful to operation of semiconductor devices. For example, a large amount of charge in dielectrics cab reduce the mobility of field effect transistors (FET's) and also alter a voltage applied to turn on an FET. In this case, it is difficult to design a circuit using the FET's. Thus, it is desirable to create a dielectric with little or no charge.

Figure 3:
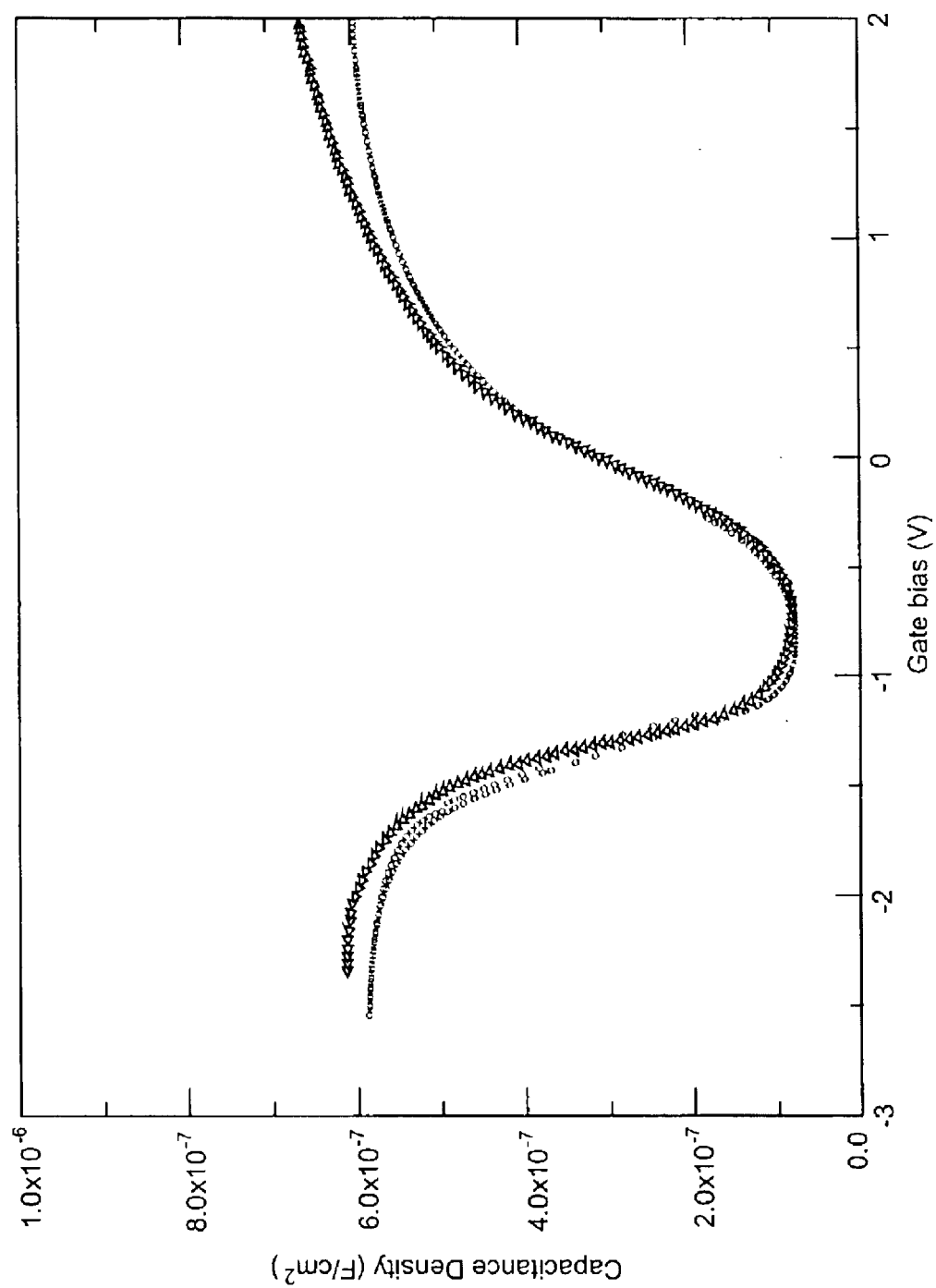
FIGS. 3 and 4 are diagrams for explaining an increased capacitance in the dielectric stack according to the present invention.
Figure 4:
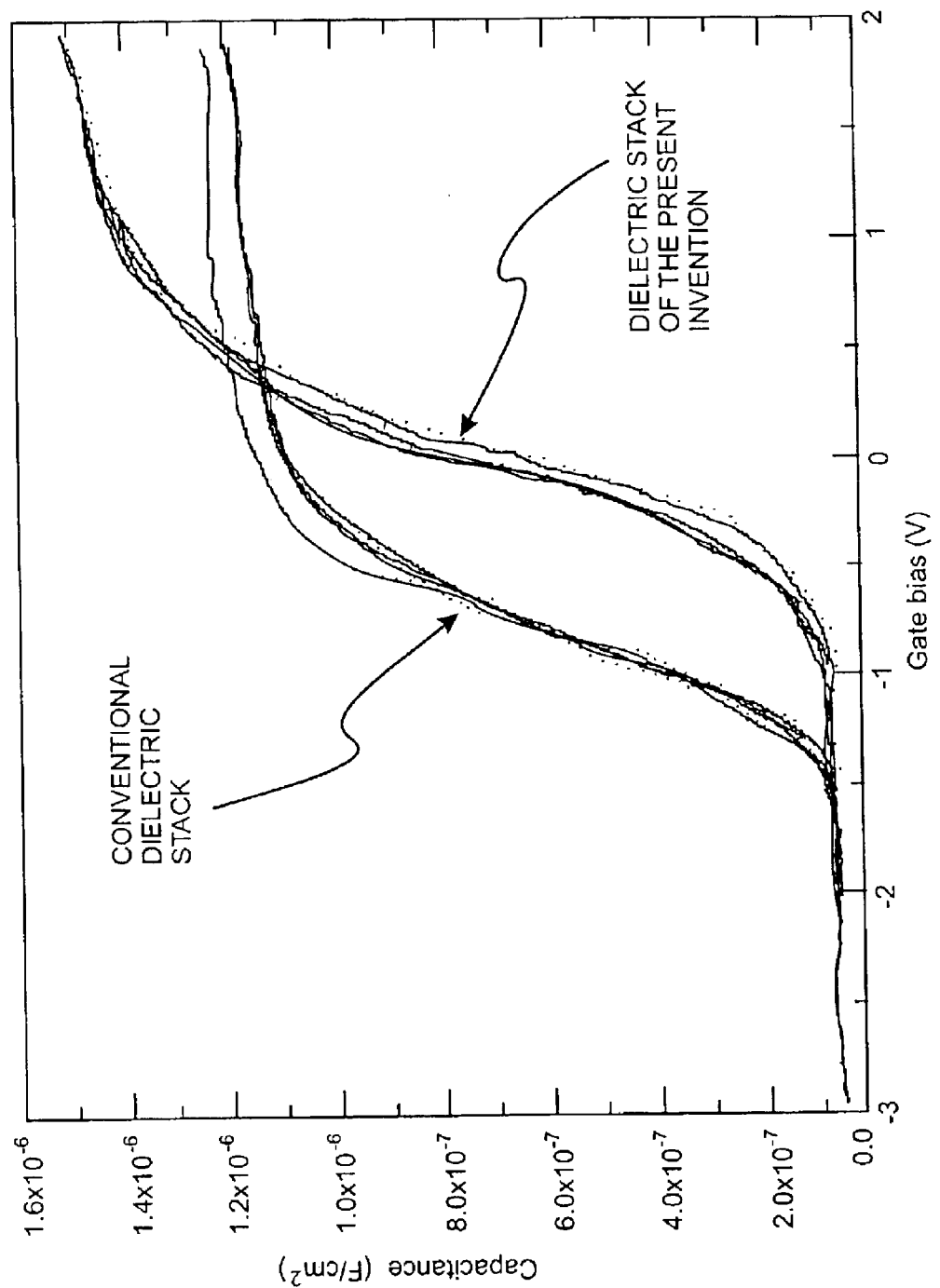

FIGS. 3 and 4 comparatively shows the presence of charge in a conventional dielectric stack and the dielectric stack of the present invention, using capacitance-voltage (C-V) curves.

FIG. 3 shows the high frequency and quasi-static capacitance-voltage profiles of the Y-based oxide film that is deposited at about 580° C. Measurements can be performed at about 100 KHz. The overlap of the quasi-static and high frequency traces indicates a well-passivated interface with an interfacial trap density below about $10^{11}$ cm$^{-2}$. In the measurements, no frequency dependence is observed in the frequency range of about 10–200 kHz, and no hysteresis is observed. The data shown in FIG. 3 are for a capacitor structure that has undergone a post-metallization anneal in air at temperature about 300° C. and the high-frequency trace is typical of a diffusion bounded capacitor. Charge in the dielectric stack will shift the x-axis of the C-V curve. In FIG. 3, very little charge is detected, because the dielectric stack is passivated with the forming gas anneals.

FIG. 4 shows an increase in the capacitance of the dielectric stack formed using the method according to the present invention. Electrical measurements are carried out by metallizing samples with $5 \times 10^{-3}$ cm$^2$ dots.

From the measurements in FIG. 4, it is shown that a conventional dielectric stack device (i.e., a dielectric stack device formed without the annealing process described above) has a capacitance density of about $1.15 \times 10^{-6}$ farads/cm$^2$, which is equivalent to a SiO$_2$ layer with thickness of about 21.2 Å, and that the dielectric stack device formed according to the present invention has a capacitance density of about $1.48 \times 10^{-6}$ farads/cm$^2$, which is equivalent to a SiO$_2$ layer with thickness of about 16.3 Å. Such results thus demonstrate that the method for forming the dielectric stack according to the present invention has the effect of increasing the capacitance of the structure.

In FIG. 4, the conventional dielectric stack device has a "–1" volt shift in the voltage scale (i.e., delta Vfb=–1), indicating unacceptable quantities of charge. On the contrary, the dielectric stack device of the present invention shows a "0" volt shift (i.e., delta Vfb=0).

In the present invention, the dielectric stack is passivated with the high temperature treatment, without additional forming gas (FGA) or post-metal annealing (PMA). FGA or PMA is generally used for the passivation, but interfacial SiO$_2$ layer may be introduced due to gas impurities. The interfacial SiO$_2$ layer limits the capacitance of the device. In the present invention, since the dielectric stack device is passivated after the high temperature annealing, FGA and PMA are unnecessary. As a result, the dielectric stack of the present invention can have greater capacitance.

It should also be noted that the dielectric stack of the present invention has a characteristic represented by a capacitance-voltage curve indicating a flat-band voltage shifted by less than about 200 mV from an ideal, fully-passivated capacitor having SiO$_2$ and Si layers and a metallization layer with the substantially same work-function as Al.

Figure 5:
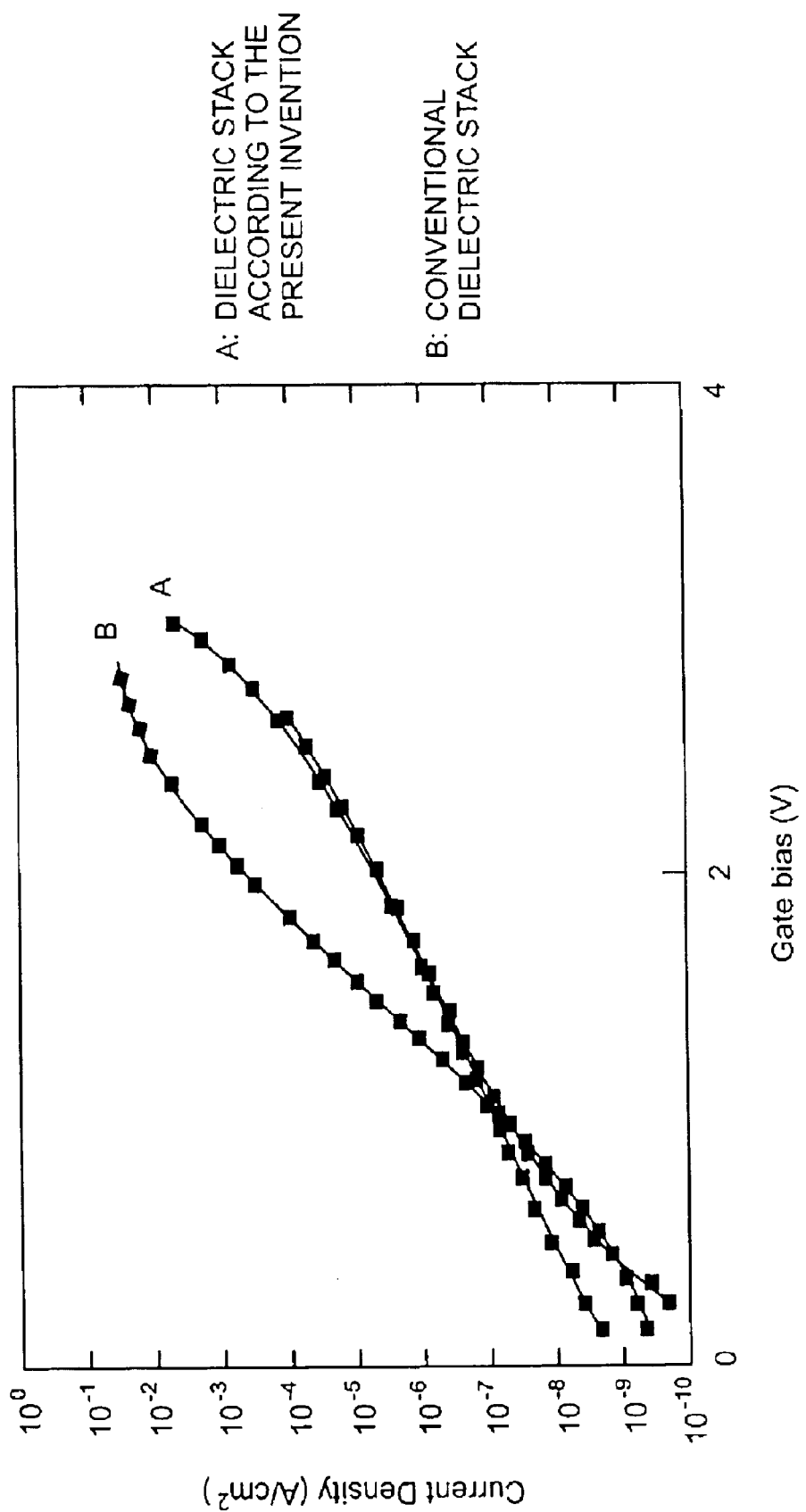
FIG. 5 is a graph for comparatively explaining leakage current in a conventional dielectric stack and the dielectric stack according to the present invention.

FIG. 5 shows a decrease in a leakage current possibly flowing in the dielectric stack formed using the method according to the present invention. As shown in FIG. 5, when the gate bias voltage is below about 1 volt, the amount of leakage current in the dielectric stack of the present invention is slightly higher than that in a conventional dielectric stack. When the gate bias voltage is about 1 volt, the amounts of the leakage currents in the dielectric stack of the present invention and in the conventional dielectric stack are substantially same. Leakage current measured in the stack is about $10^{-8}$ A/cm$^{-2}$ at +1 V for a film with an SiO$_2$ equivalent electrical thickness of 2.1 nm. When the gate bias voltage is above 1 volt, the dielectric stack of the present invention has significantly lower leakage current than that in the conventional dielectric stack.

Figure 6:
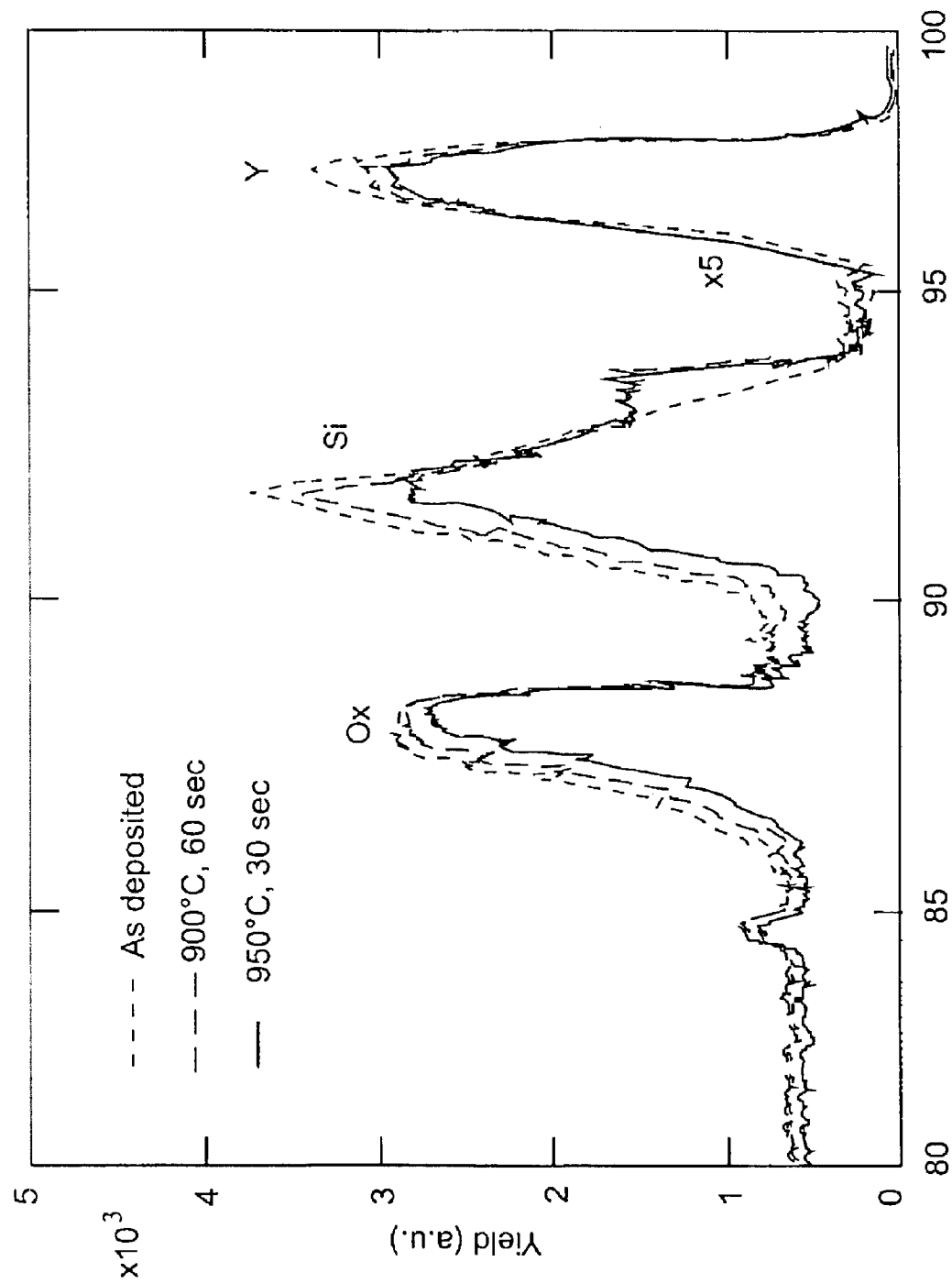
FIG. 6 is a graph for explaining the depth distribution of elements, yttrium, silicon, and oxygen.

Referring to FIG. 6, there is provided a diagram for explaining medium energy ion scattering (MEIS) spectra for various stages of the reaction between Y$_2$O$_3$, SiO$_2$ and Si. The peaks in the spectra are labeled for "Y", "Si", and "Ox", respectively. The width of each peak indicates the depth distribution of each element. In the diagram, the dashed curve represents a sample before the annealing. The sample is heated, and Y$_2$O$_3$ reacts with SiO$_2$ to form Y$_2$Si$_2$O$_7$. The "Y" peak is broadened, since it is mixed with SiO$_2$, and it extends over a greater depth. The "Si" peak moves up to a higher energy, since it is no longer buried underneath the Y$_2$O$_3$, but is mixed throughout the film.

The solid curve represents the sample after the final annealing. The "Ox" peak is narrowed, indicating that oxygen has desorbed from the sample due to the volatilization of the interfacial SiO$_2$ layer. The portion of the Si that is in the silicate remains the same. The lower part of the "Si"

peak, at around 91 keV, becomes much smaller. This is because Si in the interfacial $SiO_2$ layer is volatilized. The "Si" peak does not completely disappear, because there is a contribution from the Si substrate.

In addition to the embodiments described above, there is provided in Table 1 varying amounts of Y-based oxide ($Y_2O_3$) deposited on $SiO_2$ layer having different thicknesses. The annealing processes are performed with respect to the sample (i.e., the stack of the metal-oxide and $SiO_2$ layers) at temperatures to eliminate the interfacial $SiO_2$ layer. As a result, a desirable silicate dielectric can be obtained.

TABLE 1

| $Y_2O_3$ (Å) | $SiO_2$ (Å) | Temp. (° C.) | Thickness (Å) | Si/(Si + Y) |
|---|---|---|---|---|
| 17 | 8 | 900 | 27 | 30% |
| 24 | 8 | 900 | 35 | 26% |
| 27 | 23 | 950 | 36 | 31% |
| 22 | 23 | 950 | 25 | 18% |
| 8 | 8 | 800 | 14 | 43% |
| 15 | 13 | 850 | 27 | 36% |

It should be noted that the method for forming the dielectric stack according to the present invention is applicable to thicker interfacial $SiO_2$ layers than those in Table 1, and also applicable to thinner metal-oxide layers. Thinner equivalent oxide ranges should be achievable by the method of the present invention.

By using the method of the present invention, it is possible to eliminate the process of etching the silicon substrate with HF solution prior to the deposition of the metal-oxide layer. Since the HF etching is not only a costly procedure but also has adverse effects such as contaminating and/or roughening the substrate, it would be highly advantageous to eliminate the etching process.

In the formation of the dielectric stack according to the present invention, it is possible to fabricate very thin silicate layers through a simpler procedure. This is because the final thickness of the silicate layer is determined by the amount of metal (e.g., Y) that is initially deposited, not by the amount of $SiO_2$. In other words, thinner dielectrics can be obtained simply by reducing the amount of Y or Y-based oxide that is deposited on the substrate. Since the $SiO_2$ layer is not a determining factor of the thickness of the dielectric stack, a moderately thick $SiO_2$ layer can be used in the method for forming the dielectric stack according to the present invention.

Having described preferred embodiments of the method for fabricating the dielectric stack according to the present invention, modifications and variations can be readily made by those skilled in the art in light of the above teachings. For example, the method of the present invention is applicable not only to the formation of a gate dielectric for field effect transistors but also to formation of an insulating barrier for a charge storage in a memory device. It is therefore to be understood that, within the scope of the appended claims, the present invention can be practiced in a manner other than as specifically described herein.

What is claimed is:

1. A dielectric stack device, comprising:

a silicon substrate; and a silicate layer in direct contact with the silicon substrate, wherein substantially no interfacial layer exists between the silicon substrate and the silicate layer, wherein the dielectric stack has a capacitance-voltage characteristic providing a flat-band voltage shifted by less than about 200 mV from a fully-passivated capacitor having $SiO_2$ and Si layers and a metallization layer with a substantially same work-function as Al.

2. The dielectric stack device of claim 1, wherein the silicate layer is substantially free of pinholes.

3. The dielectric stack device of claim 1, wherein the silicate layer contains Yttrium.

4. The dielectric stack device of claim 3, wherein the silicate layer contains silicon and Yttrium such that a ratio of silicon verses silicon and Yttrium is between about 18% and about 50%.

5. The dielectric stack device of claim 1, wherein the silicate layer is a gate dielectric of a FET (field effect transistor).

6. The dielectric stack device of claim 1, wherein the silicate layer is a dielectric layer of a ferroelectric memory element.

7. The dielectric stack device of claim 1, wherein the silicate layer is a dielectric layer of a capacitor.

8. The dielectric stack device of claim 1, wherein the silicate layer further includes at least one other metal compound in a group consisting of Al, Zr, Hf, La, Sc, Gd, Mg, Ti and Ce.

* * * * *